(12) United States Patent
Hamada et al.

(10) Patent No.: US 7,679,891 B2
(45) Date of Patent: Mar. 16, 2010

(54) PANEL INSTRUMENT

(75) Inventors: Takayuki Hamada, Tokyo (JP); Akio Morita, Tokyo (JP); Manabu Aoki, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 500 days.

(21) Appl. No.: 11/595,359

(22) Filed: Nov. 9, 2006

(65) Prior Publication Data

US 2007/0120702 A1    May 31, 2007

(30) Foreign Application Priority Data

Nov. 11, 2005   (JP)   ............. P.2005-328135

(51) Int. Cl.
H05K 5/00 (2006.01)
H05K 7/00 (2006.01)
G08G 1/123 (2006.01)

(52) U.S. Cl. ............... 361/679.21; 361/679.22; 361/679.26; 340/995.26

(58) Field of Classification Search ......... 361/681, 361/679.21, 679.22, 679.26; 340/995.26, 340/971

See application file for complete search history.

(56) References Cited

U.S. PATENT DOCUMENTS 4,532,513 A * 7/1985 Halvorson ............ 340/971
5,467,085 A * 11/1995 Dunn ................... 340/971
6,525,667 B1 * 2/2003 Fujita et al. .......... 340/815.4
2008/0094255 A1 * 4/2008 Bethel ................. 340/971

OTHER PUBLICATIONS

Yokogawa Electric Corporation, General Specifications, PR201 Power Monitor (Sep. 1, 2004). (1 copy in Japanese language; 1 copy in English language).
Yokogawa Electric Corporation, General Specifications, UZ005 Power Monitor (Sep. 1, 2004). (1 copy in Japanese language; 1 copy in English language).
Website of Electro Industries/GaugeTech, http://www.electroind.com/shark.html (Nov. 9, 2006).

* cited by examiner

Primary Examiner—Jayprakash N Gandhi
Assistant Examiner—Anthony M Haughton
(74) Attorney, Agent, or Firm—Westerman, Hattori, Daniels & Adrian, LLP

(57) ABSTRACT

A panel instrument to be mounted in a panel board, including: a main body having an outside dimension applicable to a first and a second panel instrument size standards; a display provided on one end of the main body and having an area that occupies a part of a front face of the panel board and is applicable to the first panel instrument size standard; a front panel mounted on a front face of the display; and a rear panel for holding the display with the front panel, wherein the rear panel has: first mounting holes that are provided on one diagonal line of the rear panel and correspond to a mounting hole standard applicable to the second panel instrument size standard; and second mounting holes that are provided on the other diagonal line and correspond to a mounting hole standard applicable to a third panel instrument size standard.

8 Claims, 6 Drawing Sheets

PANEL INSTRUMENT

This application claims foreign priority based on Japanese Patent application No. 2005-328135, filed Nov. 11, 2005, the content of which is incorporated herein by reference in its entirety.

BACKGROUND OF THE INVENTION

1. Field of the Invention

The present invention relates to a panel instrument that is applicable to a plurality of panel instrument size standards.

2. Description of the Related Art

There are standards related to a mounting structure of the panel instrument, such as JIS (Japanese Industrial Standards) standard, DIN (Deutsche Industrie Normen) standard and ANSI (American National Standards Institute) standard. The following documents are related arts of the panel instrument: "PR201 Electric Power Monitor", General Specifications, issued by YOKOGAWA ELECTRIC CORPORATION, No. GS77C01C01-01, October 2005, 4th Edition, P8; "UZ005 Electric Power Monitor", General Specifications, issued by YOKOGAWA ELECTRIC CORPORATION, No. GS77C01U01-01, October 2005, 4th Edition, P8; A website of Electro Industries/Gauge Tech, "HOT NEWS PRODUCT/ SHARK100" to "DOWNLOADS/ SHARK100DIMENSIONS (pdf)", "Searched on Nov. 9, 2005", Internet <URL:http://www.electroind.com/pdf/ SharkDim.pdf>.

FIGS. 4A-4E are explanatory diagrams of a configuration of the related art example, in which the panel instrument "PR201 Type Electric Power Monitor" disclosed in "PR201 Electric Power Monitor", General Specifications, issued by YOKOGAWA ELECTRIC CORPORATION, No. GS77C01C01-01, October 2005, 4th Edition, P8, is attached to a panel based on the JIS standard. FIG. 4A is a front elevation of the panel instrument; FIG. 4B is a side elevation; FIG. 4C is a top plan view; FIG. 4D is a back elevation; and FIG. 4E is a panel cutout diagram.

The panel instrument has a front-face panel occupying size (size that occupies a part of front face of a panel) of 110×110 mm. The panel cutout is a circular hole having a diameter of 101 mm for inserting a body of the panel instrument, and a pitch of mounting holes for mounting the front-face panel of the panel instrument is 90 mm in the orthogonal X-Y direction. These values respectively satisfy a size standard of the JIS standard of C1103-1984:KW3a type.

FIGS. 5A-5E are explanatory diagrams of a configuration of the related art example, in which the panel instrument "UZ005 Type Electric Power Monitor" disclosed in "UZ005 Electric Power Monitor", General Specifications, issued by YOKOGAWA ELECTRIC CORPORATION, No. GS77C01U01-01, October 2005, 4th Edition, P8, is attached to a panel based on the DIN standard. FIG. 5A is a front elevation of the panel instrument; FIG. 5B is a side elevation; FIG. 5C is a top plan view; FIG. 5D is a back elevation; and FIG. 5E is a panel cutout diagram.

The panel instrument has a front-face panel occupying size of 96×96 mm. The panel cutout has a rectangular hole of 92 mm, and satisfies a size standard of the DIN standard of DIN 43 700: a square of 96 mm.

FIGS. 6A-6D are explanatory diagrams of a configuration of another related art example, in which the panel instrument "SHARK100" disclosed in the website of Electro Industries/ Gauge Tech, "HOT NEWS PRODUCT/SHARK100" to "DOWNLOADS/SHARK100DIMENSIONS (pdf)", "Searched on Nov. 9, 2005", Internet <URL:http://www.electroind.com/pdf/SharkDim.pdf> is attached to a panel based on the ANSI standard. FIG. 6A is a front elevation of the panel instrument; FIG. 6B is a side elevation; FIG. 6C is a back elevation; and FIG. 6D is a panel cutout diagram.

The panel instrument has a front-face panel occupying size of 123.19×123.19 mm. The panel cutout is a circular hole having a diameter of 101 mm for inserting the body of the panel instrument, and a pitch of mounting holes for mounting the front-face panel of the panel instrument is 85.85 mm in the orthogonal X-Y direction. These values respectively satisfy the size standards of the ANSI standard of ANSI C39. 1:4" Round Form.

For these panel instruments of the related arts, individual casings are prepared for the individual standards such as the JIS standard, the DIN standard and the ANSI standard.

In this case, a plurality of kinds of casings has to be prepared so as to correspond to the various standards. This may make it necessary to make initial investments for the molds of the casings, etc., and to design printed boards to be placed in the casings according to the individual casings.

At the time of distribution, the preparations for the stocks of the panel instruments according to the various standards have to be made, which increases the cost.

In the related art example of FIGS. 6A-6D, moreover, a trunk section of the casing is formed to conform to the round hole of the ANSI standard and the square hole of the DIN standard. However, the front-face panel section having a display section to be arranged in the front face of the panel conforms only to the ANSI standard (a square of 110 mm). Therefore, compatibility with the panel instrument of the DIN standard (a square of 96 mm) cannot be obtained, and the panel instrument of the ANSI standard may not be able to be replaced with the panel instrument of the DIN standard.

SUMMARY OF THE INVENTION

The present invention has been made in view of the above circumstances, and provides a panel instrument which can be applied to any standard of a plurality of panel instrument size standards having similar but different panel cutout holes thereby to replace the existing panel instruments easily, so that the investment in development and the cost in distribution can be reduced by making its casing in common.

In some implementations, a panel instrument of the invention comprising:

a main body to be inserted into a panel cutout hole of a panel board;

a display section provided on one end of the main body so as to be arranged in a front face of the panel board; and an adapter attached to an outer periphery of the display section removably and selectively according to a size of the panel cutout hole.

In the panel instrument of the invention, the adapter includes:

a front panel mounted on a front face of the display section; and a rear panel for holding the display section in association with the front panel.

In the panel instrument of the invention, the front panel and the rear panel are ring-shaped.

In some implementations, a panel instrument to be mounted in a panel board, the panel instrument of the invention comprising:

a main body having an outside dimension that is applicable at least to a first panel instrument size standard and a second panel instrument size standard;

a display section provided on one end of the main body and having an area that occupies a part of a front face of the panel board, the area being applicable to the first panel instrument size standard;

a front panel mounted on a front face of the display section; and a rear panel for holding the display section in association with the front panel, wherein the rear panel has:

first mounting holes that are provided on one diagonal line of the rear panel and correspond to a mounting hole standard applicable to the second panel instrument size standard; and second mounting holes that are provided on the other diagonal line of the rear panel and correspond to a mounting hole standard applicable to a third panel instrument size standard.

In the panel instrument of the invention, the display section is flanged-shaped, and the front panel and the rear panel are ring-shaped.

In the panel instrument of the invention, the first panel instrument size standard is a DIN (Deutsche Industrie Normen) standard, the second panel instrument size standard is a JIS (Japanese Industrial Standards) standard, and the third panel instrument size standard is an ANSI (American National Standards Institute) standard.

Accordingly, the panel instrument is obtained which is applicable to any standard of the plurality of panel instrument size standards having similar but different panel cutout holes.

Further, the panel instrument is obtained which can be easily replaced with the panel instrument of the existing apparatus.

Further, the panel instrument is provided which achieve reduction in the investments in development and the cost in distribution by making the casing of the panel instrument in common.

According to the panel instrument of the invention, since the JIS standard, the DIN standard and the ANSI standard are used, the panel instrument can be obtained that is applicable to any of the standards having similar but different panel cutout holes, such as the JIS standard, the DIN standard and the ANSI standard.

DESCRIPTION OF THE PREFERRED EMBODIMENTS

The present invention will be described in detail with reference to the accompanying drawings.

Figure 1:
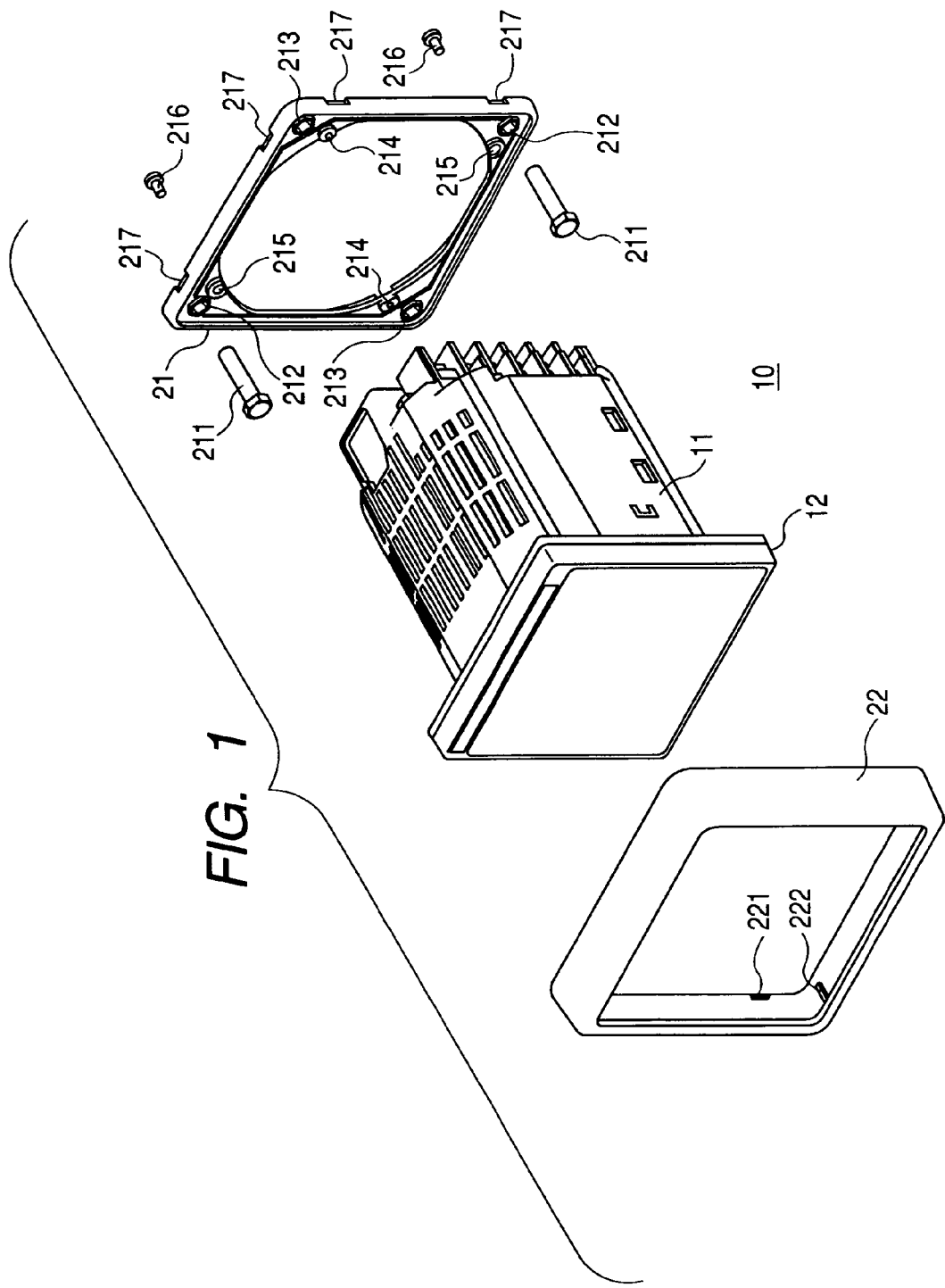
FIG. 1 is an explanatory perspective view showing a configuration of one embodiment of the invention.
Figure 2:
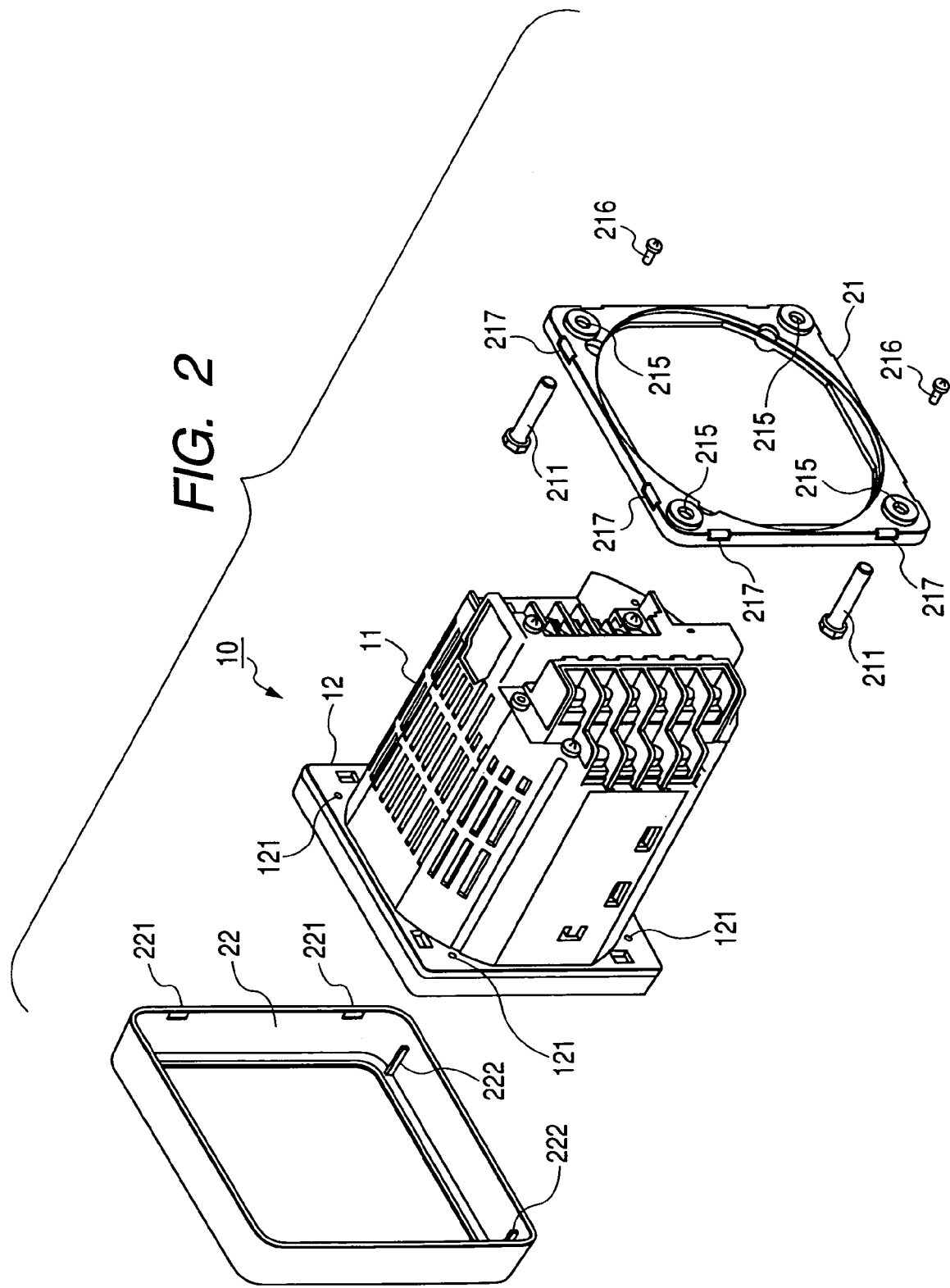
FIG. 2 is an explanatory perspective view showing the configuration of FIG. 1 from the back side.
Figure 3A:
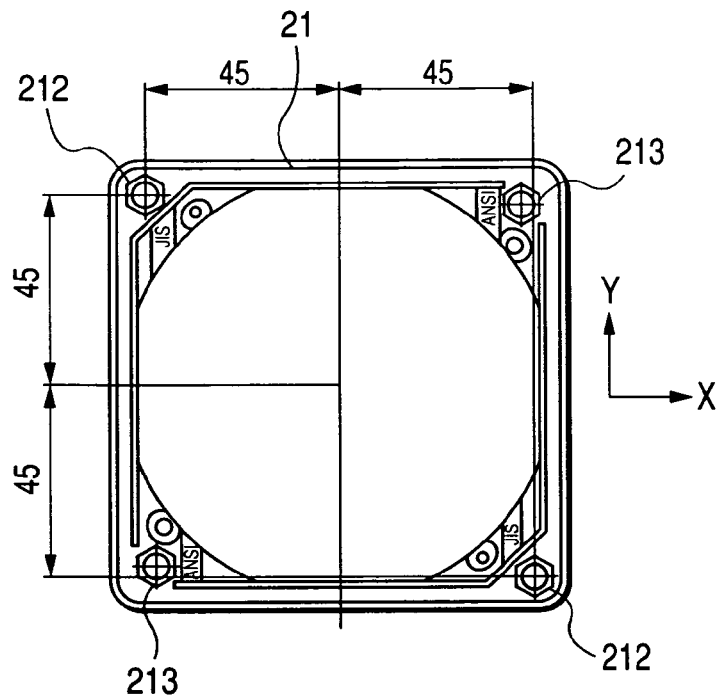
FIGS. 3A and 3B are explanatory views of the parts of FIG. 1.
Figure 3B:
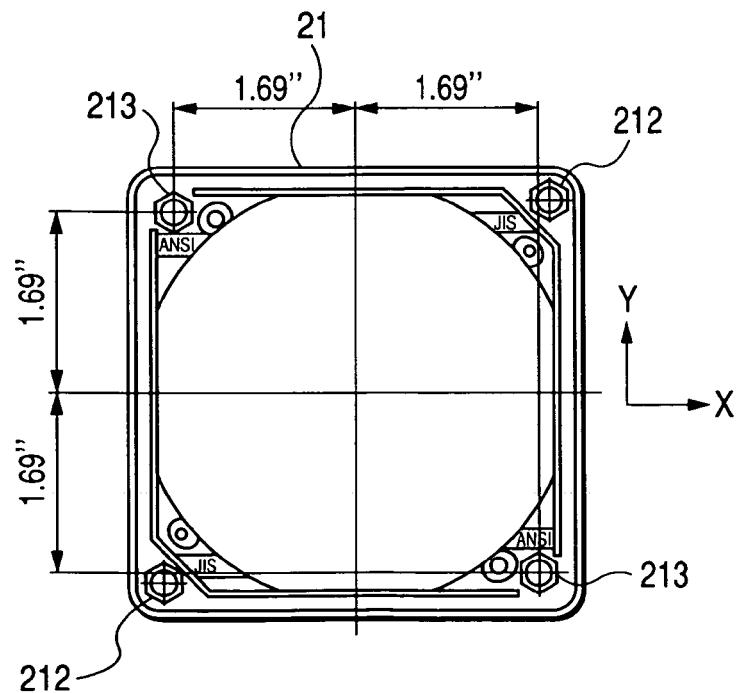
Figure 4E:
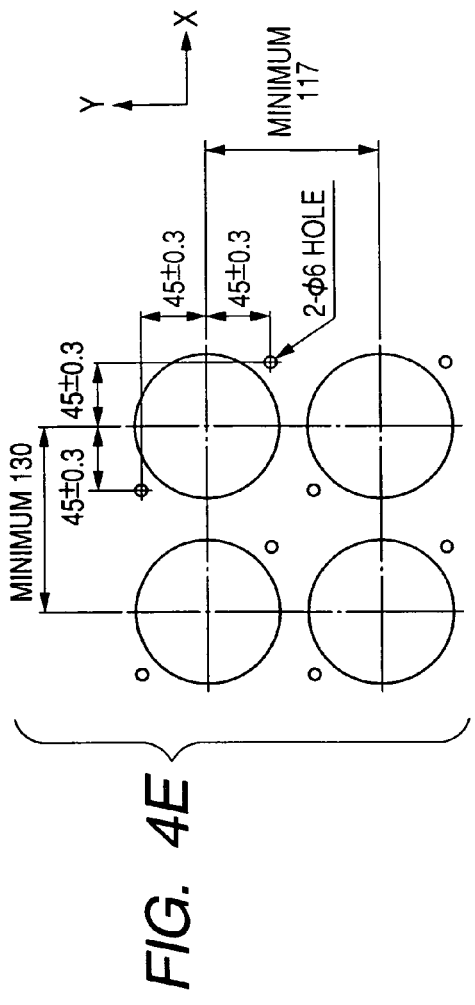
FIGS. 4A to 4E are explanatory views showing a configuration of a related art example.
Figure 4D:
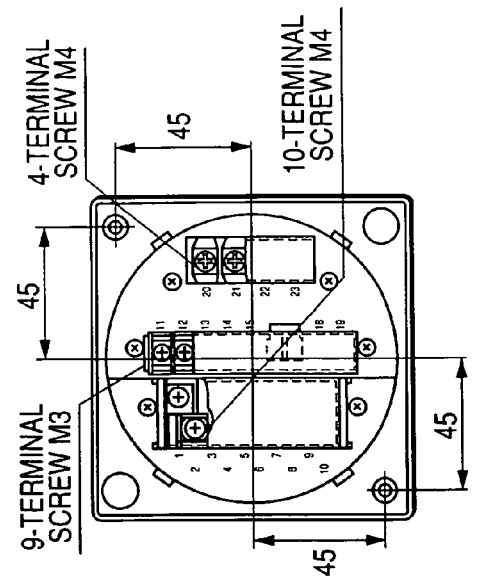
Figure 4B:
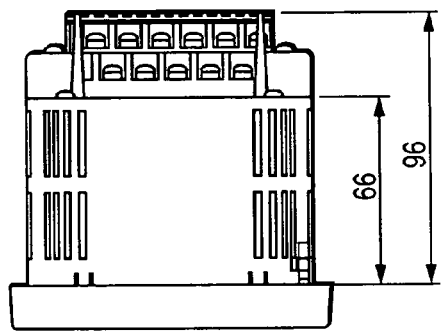
Figure 4C:
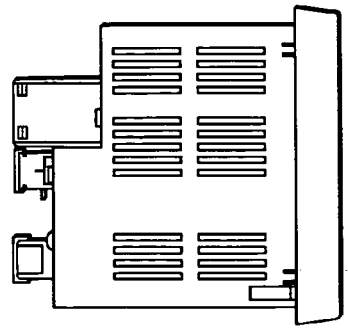
Figure 4A:
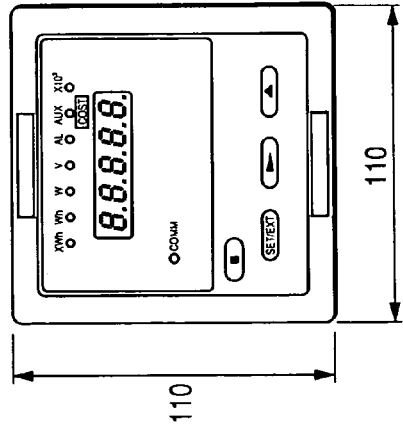
Figure 5E:
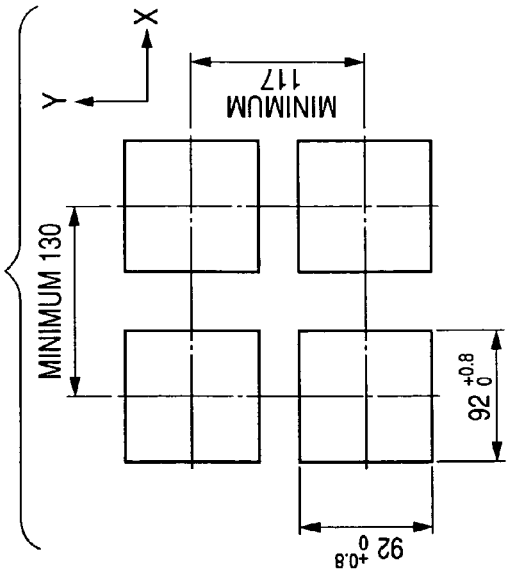
FIGS. 5A to 5E are explanatory views showing a configuration of another related art example.
Figure 5D:
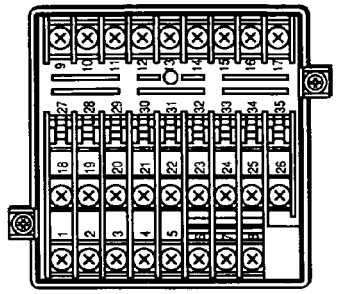
Figure 5C:
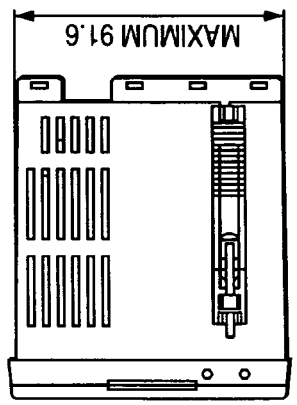
Figure 5B:
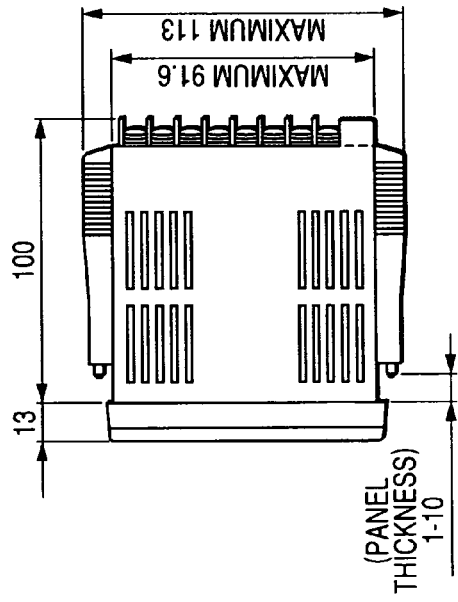
Figure 5A:
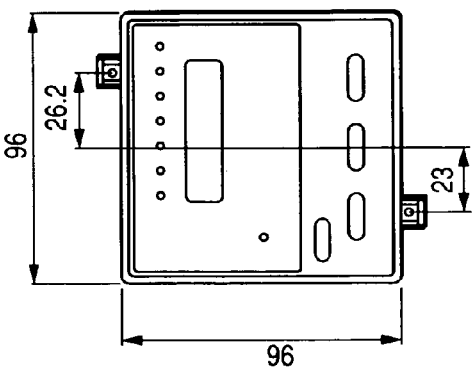
Figure 6C:
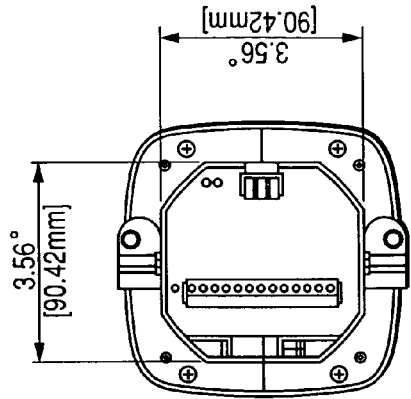
FIGS. 6A to 6D are explanatory views showing a configuration of other related art example.
Figure 6B:
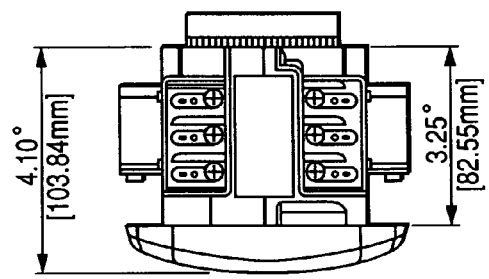
Figure 6A:
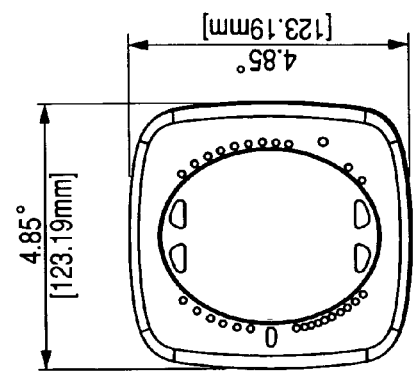
Figure 6D:
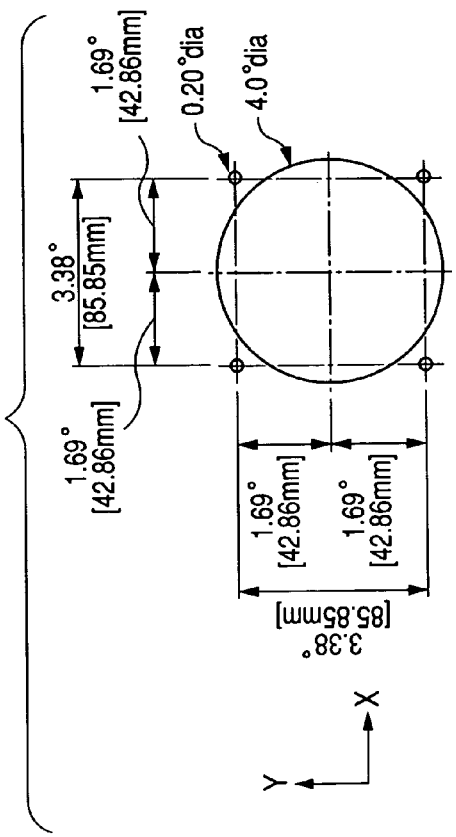

FIG. 1 is an explanatory perspective view showing a configuration of one embodiment of the present invention and taken from the front side, and FIG. 2 is an explanatory perspective view showing the configuration of the embodiment shown in FIG. 1 and taken from the back side. FIGS. 3A and 3B show explanatory views of parts in FIG. 1, and FIG. 3A shows an example conforming to the JIS standard whereas FIG. 3B shows an example conforming to the ANSI standard.

In the following, an embodiment of the JIS standard, the DIN standard and the ANSI standard will be described so as to make the description understandable. In the case of the panel instrument having a panel cutout hole of a diameter of about 100 mm, the DIN standard is the minimum for the size of the front-face panel occupying area (area that occupies a part of the front face of the panel), and a shape of the overlapping part of the DIN standard and the JIS standard is the minimum for the size of the main body shape.

In FIG. 1, a panel instrument body 10 includes a main body 11 and a display section 12 provided at one end of the main body 11.

The main body 11 is formed in a cylindrical shape and has its contour designed so as to pass through both a panel cutout rectangular hole of 92 mm of the DIN standard and a panel cutout circular hole having a diameter of 100 mm of the JIS standard. Therefore, the main body 11 also passes through a panel cutout hole having a diameter of 101 mm of the ANSI standard.

The contour of the display section 12 is formed into a flange shape of a square of 96 mm so as to satisfy the specifications of the DIN standard, in which the panel occupying area is the smallest of the aforementioned three standards. When this display section 12 is mounted in the panel cutout of either the ANSI standard or the JIS standard of which panel occupying area is larger than the ANSI standard, a rear panel 21 and a front panel 22 are used as an adapter.

In the rear panel 21, as shown in FIGS. 3A and 3B, first and second counter-sunk hexagonal holes 212 and 213 are provided, in which bolts 211 to be mounted on a panel board are press-fitted.

First of all, the first hexagonal holes 212 are provided, as shown FIG. 3A, on one orthogonal line of the rear panel 21 so as to satisfy the pitch of 90 mm in the orthogonal X-Y direction, which is the mounting hole standard of the JIS standard.

Moreover, the second hexagonal holes 213 are provided, as shown FIG. 3B, on the other orthogonal line of the rear panel 21 so as to satisfy the pitch of 3.36 inches in the orthogonal X-Y direction, which is the mounting hole standard of the ANSI standard.

The rear panel 21 is fitted in the display section 12 from the back of the main body 11. At the time of fitting the rear panel 21, the bolts 211, as press-fitted at the diagonal positions, are located lefthand above and righthand below as viewed from the front of the device. At this time, the rear panel 21 and the display section 12 are mutually located by inserting protrusions 214 of the rear panel into holes 121 formed in the display section 12. Then, screws 216 are inserted into fastening through holes 215 of the rear panel 21 and are fastened in the holes 121 formed in the display section 12.

Here, the holes 121 provided in the display section 12 serve as the holes for positioning the rear panel 21 and as screw holes for fastening. Therefore, when the panel instrument is to be changed from for the JIS standard to for the ANSI standard, for example, the rear panel 21 is rotated by 90 degrees to change the mounting position of the rear panel 21. As a result, the roles of the holes 121 are switched between the positioning holes and the screw holes for fastening.

The front panel 22 is mounted from the front face of the display section 12 on the rear panel 21. For mounting the front panel 22, hooks 221 provided on the front panel 22 are locked with notches 217 of the rear panel 21. As a result, the front panel 22 is fixed on the rear panel 21. Ribs 222 provided on the front panel 22 prevent the front panel 22 from being inserted farther from a predetermined position upon locking.

In the configuration thus far described, the panel instrument can be obtained that is applicable to a plurality of panel instrument size standards having similar but different panel cutout holes, such as the JIS standard, the DIN standard and the ANSI standard.

Moreover, the panel instrument can be obtained that is easily replaced by the existing panel instrument.

Moreover, the panel instrument can be obtained that can reduce the investments in development and the cost in distribution by making casing of the panel instrument in common.

The panel instrument can be obtained that is accurately mounted in a mounting position since the panel instrument is configured so as to attach with the hexagonal counter-sunk holes 212 and the hexagonal bolts 211.

Here, since the hexagonal bolts 211 are not fixed on the body by ultrasonic fusing or the like, the panel instrument can be easily disassembled when discarded. Moreover, since the hexagonal bolts 211 are not fixed in the body, the existing panel instruments can be easily replaced such as the replacement of the JIS standard by the ANSI standard at a client's side.

Moreover, since the rear panel 21 and the display section 12 are connected by the positioning holes 121 of the display section 12 and the protrusions 214 of the rear panel 21 to be inserted into the positioning holes 121, positioning parts in the contact faces of the rear panel and the display section can be precisely formed by the simple configuration.

The display section 12 and the rear panel 21 are screwed and fixed by the simple configuration of the positioning holes 121, the through holes 215 and the fastening screws 216. Thus, the inexpensive panel instrument is obtained in which the rear panel and the display section can be reliably fixed.

Between the rear panel 21 and the front panel 22, there is interposed the simple locking section, which is configured with the notches 217 of the rear panel 21 and the hooks 221 provided on the front panel 22 so as to be locked to the notches 217. Thus, the inexpensive panel instrument is obtained in which the front panel 22 can be easily removably mounted to the rear panel 21.

Moreover, the front panel 22 is provided with the longitudinally positioning section such as the ribs 222 for positioning the front panel 22 and the display section 12 in the longitudinal direction so that the front panel 22 is positioned in the front of the display section 12 and the display section 12 is positioned in the rear of the front panel 22. Thus, the inexpensive panel instrument is obtained in which the front panel 22 can be precisely arranged relative to the display section 12.

In short, according to the embodiment of the invention, based on the instrument 10 having the panel applicable to the DIN standard of the smallest size and the main body having the shape of both the DIN standard and the JIS standard, the front panel 22 and the rear panel 21 are used as the adapter, and the rear panel 21 is mounted by being rotated by 90 degrees, thereby to be applicable to both the JIS standard and the ANSI standard having different pitches for mounting screws. As a result, it is possible to provide a panel instrument applicable to any of the JIS standard, the ANSI standard and the DIN standard.

In the foregoing embodiment, the panel mounting screws are described to be the bolts 211 having the hexagonal heads. However, the invention should not be limited thereto, but may be exemplified by ordinary screws.

In the foregoing embodiment, moreover, the description has been made on the panel instrument having the panel cutout hole of about 100 mm in diameter. However, the hole diameter size of the panel cutout should not be limited thereto.

By enlarging the frame width size of the rear panel 21 and the front panel 22 as the adapter, for example, the panel instrument of the invention can be used to the standard in which the diameter of the panel cutout hole is larger than 100 mm.

Here, the foregoing embodiment has been simply described on the specific cases of the JIS, ANSI and DIN standards, but the invention is not limited thereto and can cope with other standards.

Here, what has been described is to present a specifically preferred embodiment for explaining and exemplifying the invention.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A panel instrument comprising:
   a main body to be inserted into a panel cutout hole of a panel board;
   a display section provided on one end of the main body so as to be arranged in a front face of the panel board; and
   an adapter removably attached to an outer periphery of the display section, the adapter is rotatable to utilize different mounting hole configurations, according to a size of the panel cutout hole, wherein the adapter further comprises:
   a front panel; and
   a rear panel, wherein the rear panel is rotatable to further utilize different pitches of mounting holes, or different shapes or sizes of the panel cutout hole.

2. The panel instrument as claimed in claim 1, wherein the front panel is mounted on a front face of the display section, and the rear panel is configured to hold the display section in association with the front panel.

3. The panel instrument as claimed in claim 2, wherein the front panel and the rear panel are ring-shaped.

4. A panel instrument to be mounted in a panel board, the panel instrument comprising:
   a main body having an outside dimension that is applicable at least to a first panel instrument size standard and a second panel instrument size standard;
   a display section provided on one end of the main body and having an area that occupies a part of a front face of the panel board, the area being applicable to the first panel instrument size standard;
   a front panel mounted on a front face of the display section; and
   a rear panel for holding the display section in association with the front panel, wherein the rear panel has:
   first mounting holes that are provided on one diagonal line of the rear panel and correspond to a mounting hole standard applicable to the second panel instrument size standard; and
   second mounting holes that are provided on the other diagonal line of the rear panel and correspond to a mounting hole standard applicable to a third panel instrument size standard;

wherein the rear panel is rotatable to further utilize different pitches of first and second mounting holes, or different shapes or sizes of the panel cutout hole.

5. The panel instrument as claimed in claim 4, wherein the display section is flanged-shaped, and the front panel and the rear panel are ring-shaped.

6. The panel instrument as claimed in claim 4, wherein the first panel instrument size standard is a DIN (Deutsche Industrie Normen) standard, the second panel instrument size standard is a JIS (Japanese Industrial Standards) standard, and the third panel instrument size standard is an ANSI (American National Standards Institute) standard.

7. A panel instrument as claimed in claim 2 further comprising:

notches provided on the rear panel; and corresponding hooks provided on the front panel, wherein the notches and hooks engage to form a locking section.

8. A panel instrument as claimed in claim 4 further comprising:

notches provided on the rear panel; and corresponding hooks provided on the front panel, wherein the notches and hooks engage to form a locking section.

* * * * *